United States Patent
Zhang et al.

(10) Patent No.: US 8,342,471 B2
(45) Date of Patent: Jan. 1, 2013

(54) SUPPORT APPARATUS

(75) Inventors: Guang-Yi Zhang, Shenzhen (CN); Hai-Chen Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 81 days.

(21) Appl. No.: 13/117,149

(22) Filed: May 27, 2011

(65) Prior Publication Data

US 2012/0273642 A1    Nov. 1, 2012

(30) Foreign Application Priority Data

Apr. 26, 2011    (CN) .......................... 2011 1 0105191

(51) Int. Cl.
*A47B 91/00*    (2006.01)

(52) U.S. Cl. ................................................. 248/346.04
(58) Field of Classification Search ............ 248/346.04, 248/346.03, 346.07, 924; 361/679.02, 679.2
See application file for complete search history.

(56) References Cited

U.S. PATENT DOCUMENTS

| | | | |
|---|---|---|---|
| 2012/0126085 A1* | 5/2012 | Johnson | 248/346.03 |
| 2012/0235005 A1* | 9/2012 | Fan | 248/346.07 |

* cited by examiner

*Primary Examiner* — Ramon Ramirez
(74) *Attorney, Agent, or Firm* — Altis Law Group, Inc.

(57) ABSTRACT

A support apparatus includes a supporting member, with two movable members movably attached to opposite sides of the supporting member, and two releasing members movably attached to each movable member respectively. The movable members can be moved out or in relative to the supporting member.

19 Claims, 7 Drawing Sheets

SUPPORT APPARATUS

BACKGROUND

1. Technical Field

The disclosure relates to a support apparatus for servers or desktop computers.

2. Description of Related Art

A server or desktop computer is often set on a support apparatus with non-retractable structure. When not in use, the support apparatus just takes up space.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
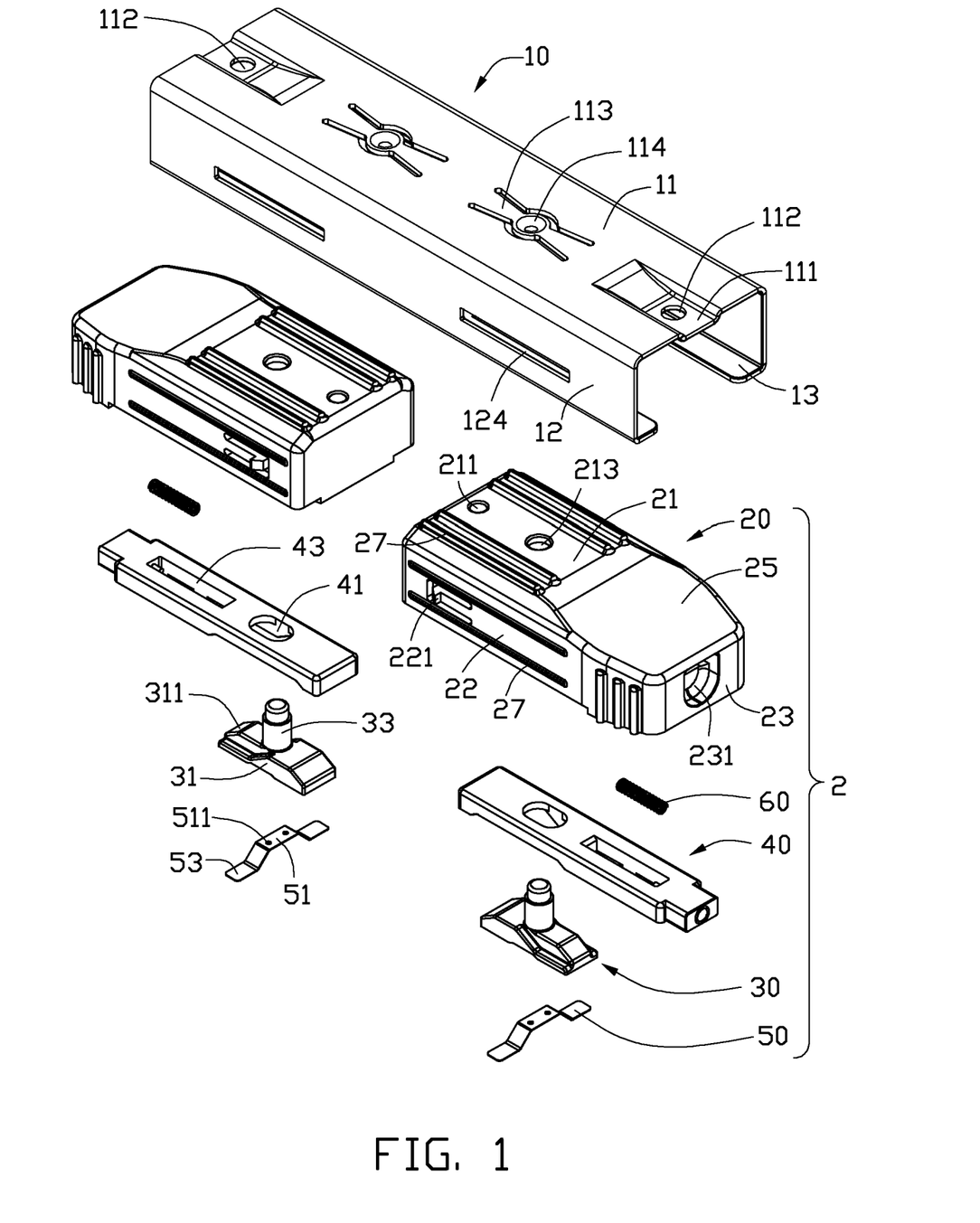
FIG. 1 is an exploded, isometric view of an exemplary embodiment of a support apparatus.
Figure 2:
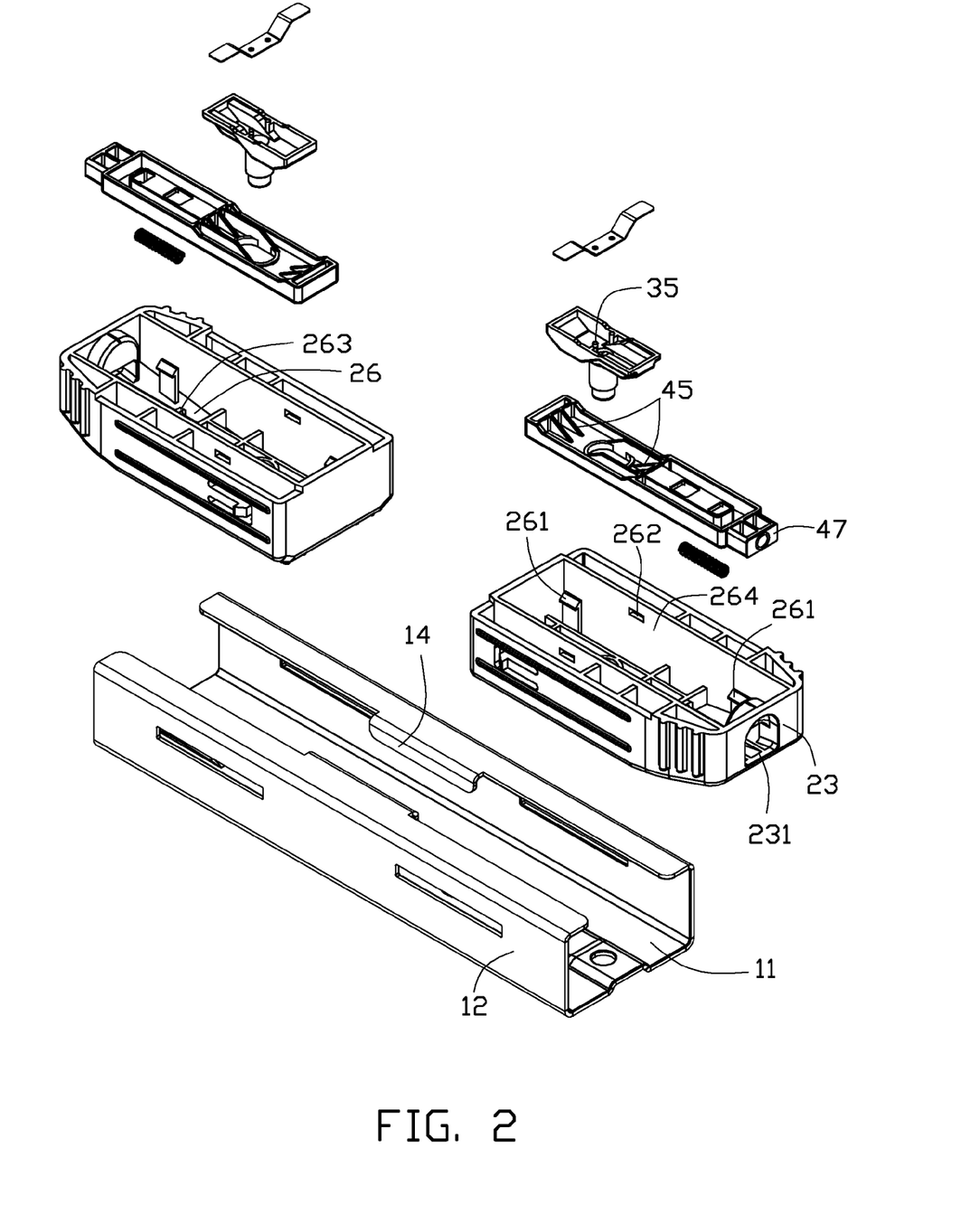
FIG. 2 is an inverted view of FIG. 1.

Referring to FIG. 1 and FIG. 2, an exemplary embodiment of a support apparatus includes a supporting member 10, and two movable assemblies 2 movably and slidably attached to opposite ends of the supporting member 10. Each movable assembly 2 includes a movable member 20, a positioning member 30, a releasing member 40, a first resilient member 50, and a second resilient member (such as a spring) 60.

The supporting member 10 can be made of metal, and is substantially in the shape of an inverted "U" The supporting member 10 includes a main plate 11, two side plates 12 perpendicularly extending down from opposite sides of the main plate 11, and two flanges 13 extending inward from the bottoms of the side plates 12. The two flanges 13 are themselves bent upwards internally to create a stopping piece 14. Two recessed portions 111 are defined at each end of the main plate 11. The recessed portions 111 each define a positioning hole 112 in the lower flat surface of the recessed portion 111. Two resilient portions 113 are formed from the main plate 11, between the recessed portions 111. The resilient portions 113 each form a nipple 114 extending down from a center of the resilient portion 13. Two limiting slots 124 are longitudinally defined in each side plate 12, substantially arranged along a straight line.

The movable member 20 includes a top wall 21, and two opposite sidewalls 22 substantially perpendicularly extending down from opposite sides of the top wall 21. One end of the movable member 20 forms an operation portion 25. An end wall 23 is formed from the operation portion 25. The top wall 21 defines a positioning hole 211 and a through hole 213, substantially arranged along a straight line. A plurality of skid-proof ribs is formed on opposite sides of the operation portion 25. The sidewalls 22 each form a resilient hook 221. The end wall 23 defines a through hole 231. A receiving portion 26 is formed in the movable member 20, below the top wall 21. The receiving portion 26 is bounded by two parallel side plates 264 longitudinally extending down from the top wall 21. Each side plate 264 defines a mounting hole 262. Two pairs of hooks 261 extend into the receiving portion 26 from a bottom of the top wall 21. A tab 263 protrudes from the bottom of the top wall 21. The through hole 231 is communicated with the receiving portion 26. A plurality of bars 27 are longitudinally formed on the sidewalls 22, extending in the sliding direction of the movable member 20.

The positioning member 30 is substantially T-shaped and includes a base 31 and a columnar positioning portion 33 perpendicularly extending up from a center of the base 31. An inclined surface 311 is formed on an end of the base 31. Two pins 35 extend down from the base 31.

The releasing member 40 defines a compressed through hole 41 and a long receiving slot 43, substantially arranged along one straight line. The releasing member 40 forms an engaging portion 45 adjacent to the through hole 41. A button 47 is formed from one end of the releasing member 40, adjacent to the receiving slot 43.

The first resilient member 50 is made from thin resilient material, and includes an arched resisting portion 51 and two mounting pieces 53 extending from opposite ends of the resisting portion 51. Two mounting holes 511 are defined in the resisting portion 51.

Figure 3:
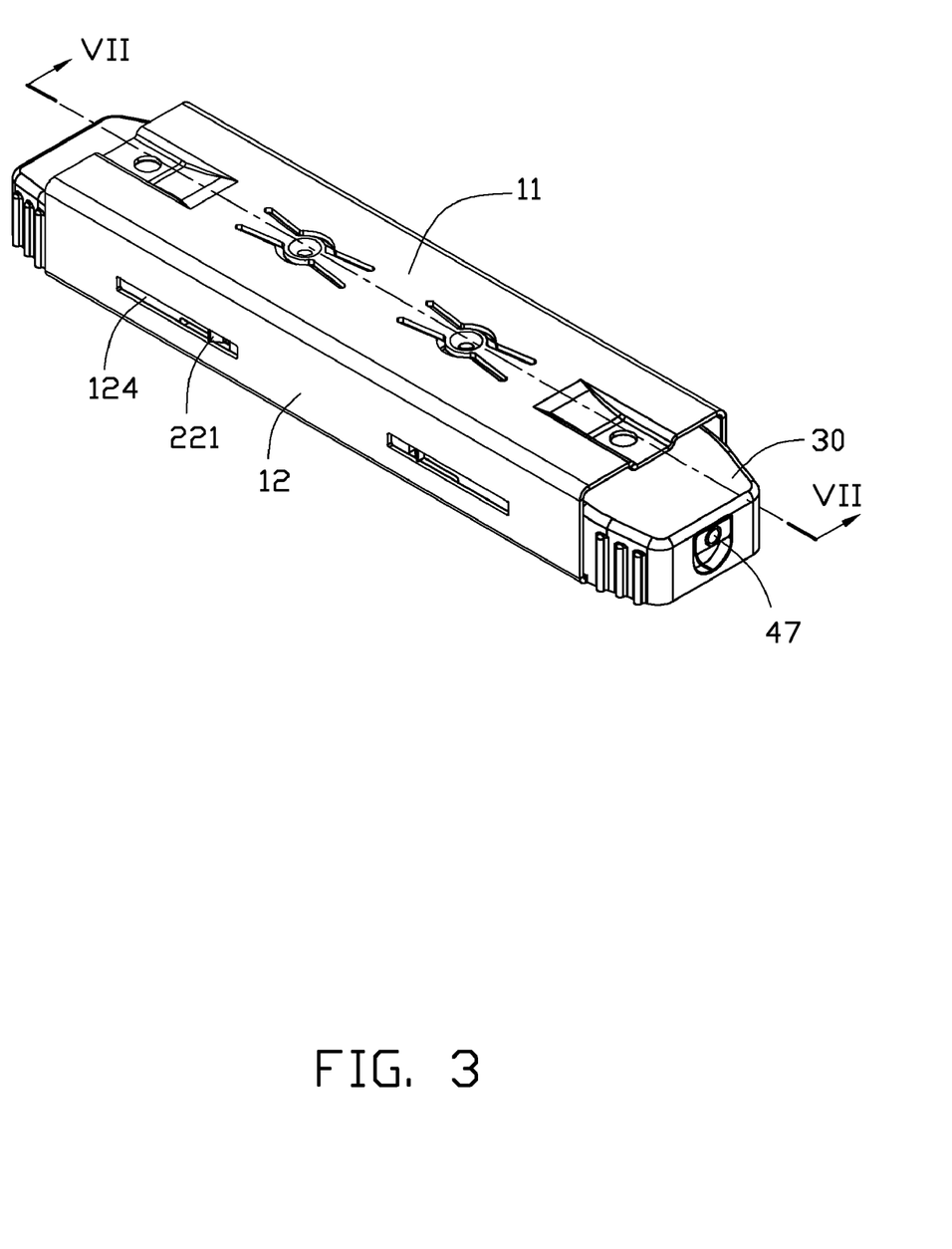
FIG. 3 and FIG. 4 are assembled, isometric views of FIG. 1 and FIG. 2, respectively.
Figure 4:
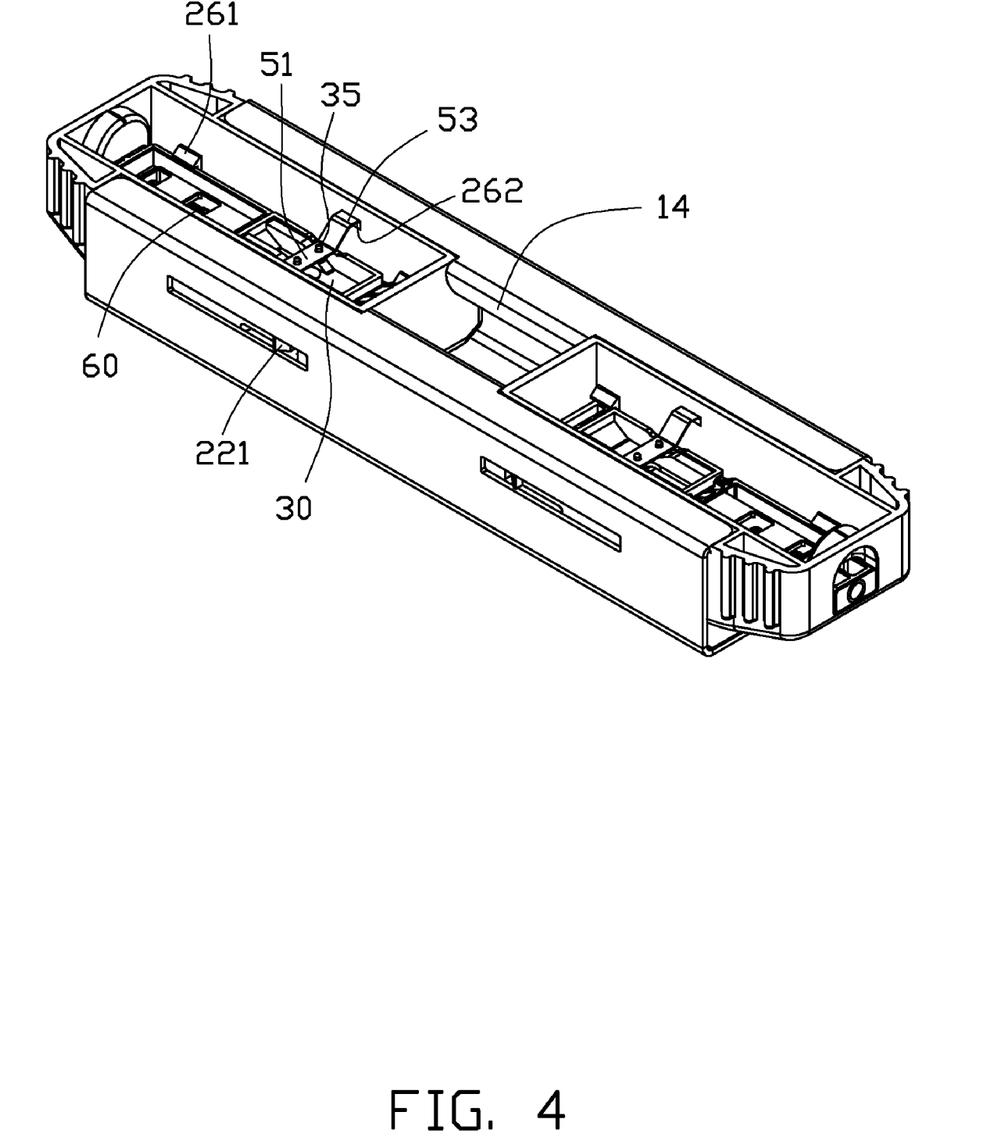
Figure 5:
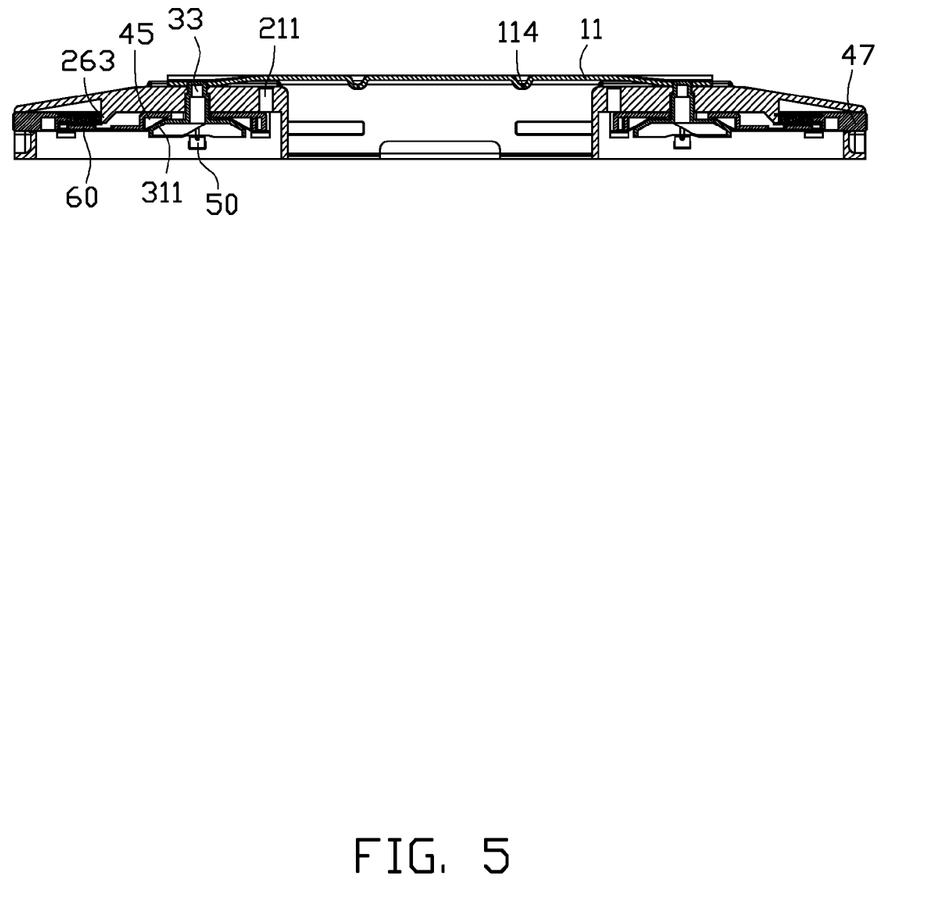
FIG. 5 to FIG. 7 are cross-sectional views of FIG. 3, taken along the line of VII-VII, but showing different states of use.

Referring to FIG. 3 to FIG. 5, to explain assembly the movable assemblies 2, one of the movable assemblies 2 is taken as an example. The releasing member 40 is movably received in the receiving portion 26 through the hooks 261. The button 47 extends through the through hole 231. The spring 60 is arranged in the receiving slot 43. The tab 263 engages in an end of the receiving slot 43. Two opposite ends of the spring 60 resist against the tab 263 and an end wall bounding the receiving slot 43 opposite to the tab 263. The positioning portion 33 extends through the through hole 41 to engage in the though hole 213. The mounting pieces 53 engage in the mounting holes 262 respectively. The resisting portion 51 resists against the bottom of the base 31. The pins 35 engage in the mounting holes 511.

The movable assemblies 2 are received in the supporting member 10 from opposite ends of the supporting member 10. The resilient hooks 221 of each movable member 20 are slidably engaged in the limiting slots 124, for limiting vertical movement of the movable member 20 relative to the supporting member 10. The top ends of the positioning portions 33 engage in the positioning holes 112, respectively.

Figure 6:
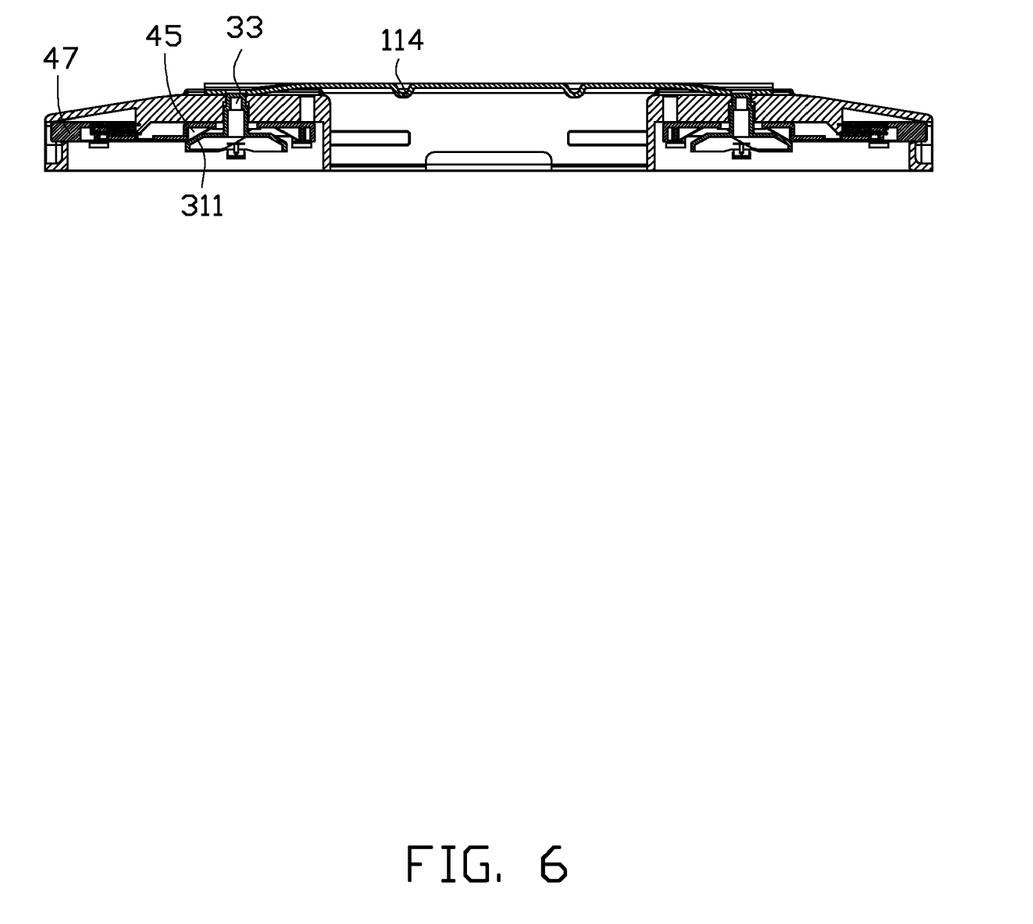
Figure 7:
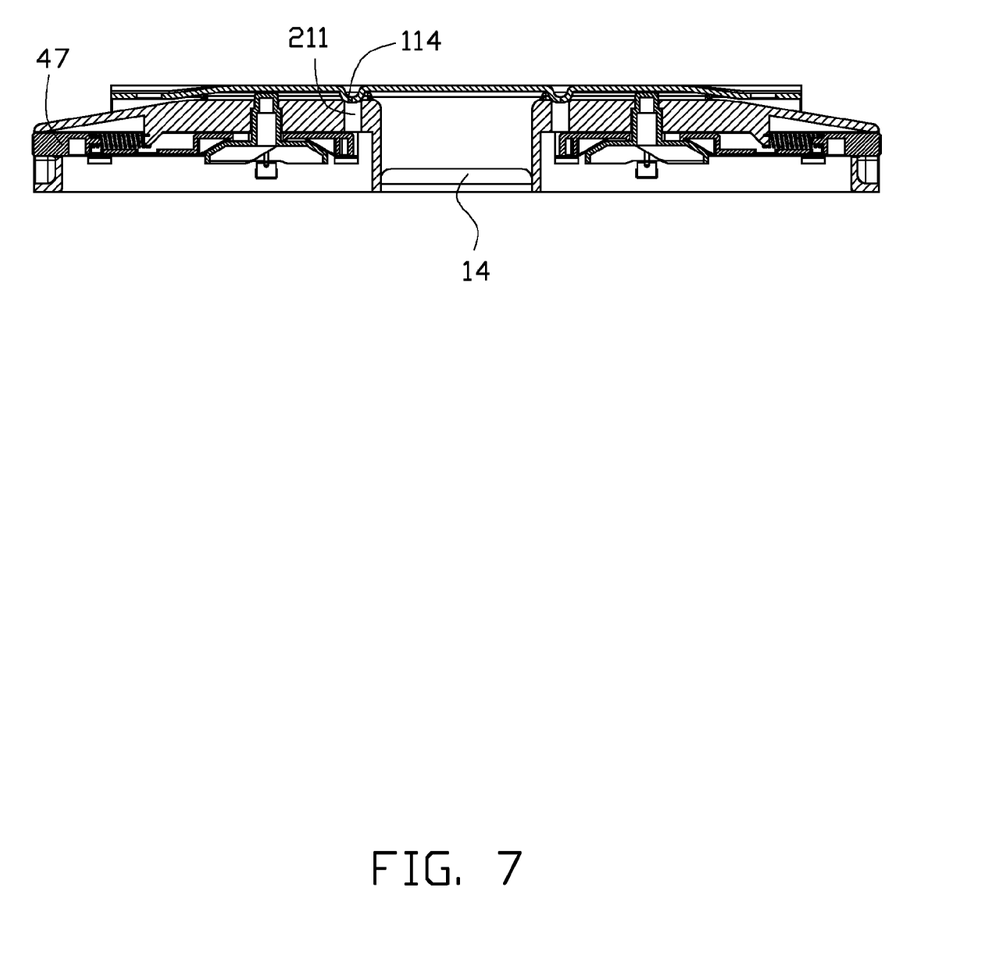

Referring to FIG. 6 and FIG. 7, to retract the movable members 20 into the supporting member 10, the buttons 47 are pressed towards each other, thereby deforming the springs 60. The engaging portions 45 resist against the inclined surfaces 311 respectively, driving down the positioning members 30 and deforming the first resilient member 50, until the positioning portions 33 are disengaged from the positioning holes 112 respectively. The operation portions 25 are operated to move in, until the nipples 114 are locked in the positioning holes 211 respectively. The buttons 47 are released.

Referring to FIG. 4, to extend the movable members 20 from the supporting member 10, the operation portions 25 are pulled against friction to release the nipple 114 from the positioning holes 211 respectively. As the movable members 20 are extended outwards, the first resilient members 50 bias the positioning portions 33 to extend through the through holes 41 and the through holes 213, thereby the positioning members 33 engage and lock in the positioning holes 112, respectively.

In the disclosure, the bars 27 are arranged between the movable members 20 and the supporting member 10 to reduce friction. The stopping pieces 14 are used for limiting the inward movement of the movable members 20.

In the disclosure, the support apparatus includes the two movable members 20 movably attached to the opposite ends of the supporting member 10, the movable members 20 can move out or in by operating only the movable members 20, which is convenient to use. At least two support apparatus of the embodiment will work together to support a device.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A support apparatus comprising:
 a supporting member comprising a main plate, the main plate defining a positioning hole therein and forming a nipple extending down;
 a movable member movably received in the supporting member from one end of the supporting member, the movable member comprising a top wall defining a through hole and a positioning hole;
 a positioning member comprising a base and a positioning portion extending up from the base, the base forming an inclined surface;
 a releasing member movably received in the movable member, the releasing member defining a through hole and forming an engaging portion; and
 a first resilient member mounted to the movable member, the resilient member comprising a resisting portion resisted against a bottom of the base of the positioning member;
 wherein the positioning portion of the positioning member is operable to extend through the through hole of the releasing member and the through hole of the movable member to engage in the positioning hole of the supporting member;
 wherein, when the positioning portion of the positioning member engages with the through hole of the movable member, the releasing member is operable to make the engaging portion of the releasing member resist against the inclined surface of the positioning member to move down the positioning member against the first resilient member to disengage the positioning portion of the positioning member from the positioning hole of the supporting member to let the movable member movable relative to the supporting member; and
 wherein, when the movable member is moved to a predetermined position, the nipple of the supporting member is operable to engage with the positioning hole of the movable member to lock the movable member.

2. The support apparatus of claim 1, wherein the supporting member comprises two side plates perpendicularly extending down from the main plate, and two flanges respectively extending inward from the side plates, a stopping piece extends toward the main plate from each of the flanges, the movable member is limited by the stopping pieces.

3. The support apparatus of claim 2, wherein a limiting slot is defined in each of the side plates, a resilient hook is formed from each of opposite sides of the movable member, the resilient hook of the movable member is slidably engaged in the limiting slot of the corresponding side plate of the supporting member.

4. The support apparatus of claim 1, wherein the movable member comprises an end wall defining a through hole, the releasing member comprises a button extending through the through hole of the end wall to be exposed out.

5. The support apparatus of claim 1, wherein a receiving portion is formed in the movable member under the top wall of the movable member, two pairs of hooks are formed from the receiving portion to position the releasing member between the top wall and the hooks.

6. The support apparatus of claim 5, wherein the receiving portion comprises two parallel side plates each defining a mounting hole, the first resilient member comprises two mounting pieces fixed to the mounting holes of the receiving portion, respectively.

7. The support apparatus of claim 1, further comprising a second resilient member arranged between the releasing member and the movable member to bias the releasing member to extend out the movable member.

8. The support apparatus of claim 7, wherein the releasing member defines a receiving slot, a tab extends from a bottom of the top wall of the movable member and slidably engages in the receiving slot, the second resilient member is received in the receiving slot, one end of the second resilient member resists against the tab, and another end of the second resilient member resists against an end wall bounding the receiving slot.

9. The support apparatus of claim 1, wherein two mounting holes are defined in the resisting portion of the first resilient member, the base of the positioning member forms two pins engaging in the mounting holes of the resisting portion of the resilient member.

10. The support apparatus of claim 1, wherein the resisting portion of the resilient member is made in metal and substantially arched.

11. A support apparatus comprising:
 a supporting member comprising a main plate defining a positioning hole and forming a nipple extending down; and
 two movable assemblies movably received in the supporting member from two opposite ends of the supporting member, each of the movable assemblies comprising:
  a movable member movably received in the supporting member from a corresponding end of the supporting member, the movable member comprising a top wall defining a through hole and a positioning hole;
  a positioning member comprising a base and a positioning portion extending on the base, the base forming an inclined surface;
  a releasing member slidably received in the movable member, the releasing member defining a through hole and forming an engaging portion extending down; and
  a first resilient member mounted to the movable member, the first resilient member comprising a resisting portion resisted against a bottom of the base of the positioning member;
 wherein the positioning portion of the positioning member extends through the through hole of the releasing member and the through hole of the movable member to engage in the positioning hole of the supporting member;

wherein, when the positioning portion of the positioning member engages with the through hole of the movable member, the releasing member is operable to make the engaging portion of the releasing member resist against the inclined surface of the positioning member to move down the positioning member against the first resilient member to disengage the positioning portion of the positioning member from the positioning hole of the supporting member to let the movable member movable relative to the supporting member; and wherein, when the movable member is moved to a predetermined position, the nipple of the supporting member is operable to engage with the positioning hole of the movable member to lock the movable member.

12. The support apparatus of claim 11, wherein the supporting member comprises two side plates perpendicularly extending down from the main plate, and two flanges respectively extending inward from the side plates, a stopping piece extends toward the main plate from each of the flanges, the movable member is limited by the stopping pieces.

13. The support apparatus of claim 12, wherein a limiting slot is defined in each of the side plates, two resilient hooks are formed from opposite sides of each of the movable members, the resilient hooks of the movable members are slidably locked in the limiting slots of the corresponding side plates of the supporting member.

14. The support apparatus of claim 11, wherein each of the movable members comprises an end wall defining a through hole, each of the releasing members comprises a button extending through the through hole of the end wall of the corresponding movable member.

15. The support apparatus of claim 11, wherein a receiving portion is formed in each movable member under the top wall, two pairs of hooks extend down from a bottom of the top wall to position the corresponding releasing member.

16. The support apparatus of claim 15, wherein each of the receiving portions comprises two parallel side plates each defining a mounting hole, each of the first resilient members comprises two mounting pieces fixed to the mounting holes of the corresponding receiving portion.

17. The support apparatus of claim 11, further comprising a second resilient member arranged between each of the releasing members and the corresponding movable member to restore the releasing member.

18. The support apparatus of claim 17, wherein each of the releasing members defines a receiving slot, a tab extends from a bottom of the top wall of each movable member and engages in the receiving slot of the corresponding releasing member, the corresponding second resilient member is received in the receiving slot, opposite ends of the second resilient member resist against the tab and an end wall bounding the receiving slot.

19. The support apparatus of claim 11, wherein two mounting holes are defined in the resisting portion of each of the first resilient members, the base of each of the positioning members forms two pins engaging in the mounting holes of the corresponding resisting portion of the resilient member.

\* \* \* \* \*